United States Patent
Wurzel et al.

(10) Patent No.: US 8,946,561 B2
(45) Date of Patent: Feb. 3, 2015

(54) FLEXIBLE CIRCUITRY WITH HEAT AND PRESSURE SPREADING LAYERS

(75) Inventors: Joshua G. Wurzel, Sunnyvale, CA (US); Casey J. Feinstein, San Jose, CA (US)

(73) Assignee: Apple Inc., Cupertino, CA (US)

( * ) Notice: Subject to any disclaimer, the term of this patent is extended or adjusted under 35 U.S.C. 154(b) by 333 days.

(21) Appl. No.: 13/353,203

(22) Filed: Jan. 18, 2012

(65) Prior Publication Data

US 2013/0180764 A1   Jul. 18, 2013

(51) Int. Cl.
*H05K 1/00* (2006.01)
*H05K 3/36* (2006.01)

(52) U.S. Cl.
USPC .............................................. 174/254; 29/830

(58) Field of Classification Search
USPC ............................................ 174/254; 29/830
See application file for complete search history.

(56) References Cited

U.S. PATENT DOCUMENTS

| | | | |
|---|---|---|---|
| 7,541,220 B2 | 6/2009 | Bambridge et al. | |
| 7,608,923 B2 * | 10/2009 | Hsu | 257/707 |
| 7,811,097 B1 | 10/2010 | Bhakta et al. | |
| 7,889,502 B1 | 2/2011 | Reis et al. | |
| 8,076,182 B2 | 12/2011 | Lin et al. | |
| 2002/0117267 A1 * | 8/2002 | Ogawa et al. | 156/581 |

* cited by examiner

*Primary Examiner* — Timothy Thompson
*Assistant Examiner* — Charles Pizzuto
(74) *Attorney, Agent, or Firm* — Trey Law Group; G. Victor Treyz; Michael H. Lyons

(57) ABSTRACT

A flexible printed circuit may be provided with an integrated heat and pressure spreading layer. The heat and pressure spreading layer may be configured to uniformly spread heat and pressure from a bonding tool across a portion of the flexible printed circuit during bonding of the flexible printed circuit to additional circuitry. During manufacturing of the flexible printed circuit, a sheet of heat and pressure spreading material may be attached to a sheet of flexible printed circuitry and the heat and pressure spreading material and the sheet of flexible printed circuitry may be die cut to form multiple flexible printed circuits each with a heat and pressure spreading layer. An electronic device may be provided with a flexible printed circuit with a heat and pressure spreading layer coupled to a component such as a display.

20 Claims, 12 Drawing Sheets

US 8,946,561 B2

FLEXIBLE CIRCUITRY WITH HEAT AND PRESSURE SPREADING LAYERS

BACKGROUND

This relates generally to electronic devices, and more particularly, to electronic devices having flexible circuitry.

Electronic devices often include displays, printed circuit boards and flexible printed circuits. A display is often coupled to a printed circuit board using an interposing flexible printed circuit that is attached to both the display and the printed circuit board.

A flexible printed circuit is often attached to the printed circuit board and the display using an anisotropic conductive film adhesive. The anisotropic conductive film adhesive is commonly interposed between the flexible printed circuit and the printed circuit board and/or between the flexible printed circuit and the display. During manufacturing, heat and pressure are commonly applied to the flexible printed circuit in order to form conductive bonds in the interposed anisotropic conductive film adhesive.

Heat and pressure are commonly applied using a heat bar that is pressed against a top surface of the flexible printed circuit.

Non-uniformities on the flexible printed circuit can cause heat and pressure to be applied unevenly to the flexible printed circuit.

It would therefore be desirable to be able to provide improved flexible circuitry for attachment to rigid circuitry in electronic devices.

SUMMARY

An electronic device may have circuitry such as flexible circuitry. Flexible circuitry such as a flexible printed circuit may be attached to a rigid circuit member such as a rigid layer of a device display, a rigid printed circuit board, or any other suitable rigid printed circuit substrate.

An electronic device may include an electronic component mounted to the rigid circuit member. For example, a driver integrated circuit may be mounted to a thin-film transistor (TFT) glass layer of a display. Flexible circuitry such as a flexible printed circuit may be attached to the rigid circuit member using, for example, an anisotropic conductive film (ACF) adhesive in the vicinity of the electronic component.

Flexible circuitry may be provided with one or more heat and pressure spreading layers (spreader layers). A flexible printed circuit having a heat and pressure spreading layer may be die cut from one or more sheets of flexible circuitry to which a sheet of heat and pressure spreading material has been attached. The heat and pressure spreading material may form a top layer of the flexible printed circuit or may form an integrated interior layer of the flexible printed circuit.

During device assembly, bonding equipment such as a heat bar may be used to attach the flexible printed circuit to the rigid circuit member. Heat and pressure may be applied by the heat bar to the spreader layer of the flexible circuitry in order to generate conductive portions in an ACF adhesive that is interposed between the flexible printed circuit and the rigid circuit member. Conductive portions of the ACF adhesive may couple electrical contacts on the flexible printed circuit to electrical contacts on the rigid circuit member.

A spreader layer that is die cut along with the flexible circuit may facilitate precise positioning of bonding equipment during attachment of the flexible circuit to the rigid circuit member.

In this way, tolerances may be reduced for spacing between the location of attachment of the flexible circuit and the location of attachment of an electronic component on a rigid circuit member. In this way, the size of one or more lateral dimensions of a rigid circuit member such as a TFT display layer may be reduced, thereby helping to reduce the overall size of an electronic device.

Further features of the invention, its nature and various advantages will be more apparent from the accompanying drawings and the following detailed description of the preferred embodiments.

DETAILED DESCRIPTION

Electronic devices may include flexible circuitry. Flexible circuitry may include a flexible printed circuit substrate connected to one or more rigid circuit members. A rigid circuit member may be any rigid or semi-rigid circuit substrate such as a printed circuit board, a rigid layer of a display, a rigid portion of a rigid-flex circuit or any other suitable substrate that is configured to receive an electrical attachment to a flexible printed circuit. A display having a rigid layer or other rigid portion may be used to display visual information such as text and images to users.

An electronic device may include an electronic component mounted to the rigid circuit member. For example, a driver integrated circuit may be mounted to a thin-film transistor (TFT) layer of a display. Flexible circuitry may be attached to the rigid circuit member using, for example, an anisotropic conductive film (ACF) adhesive.

A flexible printed circuit may be provided with one or more insulating layers such as heat and pressure spreading layers (sometimes referred to herein as a spreader layer, a heat-spreading layer, or a pressure-spreading layer). A flexible printed circuit having a heat and pressure spreading layer may be die cut from a sheet of flexible circuitry.

A spreader layer that is die cut along with attached layers of flexible circuitry may help enable precise positioning of assembly equipment such as a heated bonding tool during attachment of the flexible circuitry to the rigid circuit member by allowing the heated bonding tool to be applied directly to the heat and pressure spreading layer of the flexible circuitry. In this way, manufacturing tolerances may be reduced for spacing between the location of an attachment of a flexible circuit and an electronic component on a rigid circuit member.

In this way, the size of one or more lateral dimensions of a rigid circuit member such as a TFT display layer may be reduced, thereby helping to reduce the overall size of an electronic device.

During assembly of the device, a heated bonding tool such as a hot bar (heat bar) may be moved into contact with the heat and pressure spreading layer so that the hot bar applies heat and pressure to the flexible circuitry for bonding to the rigid circuit member. The heat and pressure spreading layer may help spread heat and pressure evenly from a hot bar across a surface of the flexible circuitry.

Heat and pressure applied to the flexible circuitry through the spreader layer may cause portions of an ACF adhesive interposed between the flexible circuit and the rigid circuit member to become conductive. Conductive portions of the ACF adhesive may couple electrical contacts on the flexible circuitry to electrical contacts on the rigid circuit member.

Illustrative electronic devices that may be provided with flexible circuitry that includes a heat and pressure spreading layer are shown in FIGS. 1, 2, 3 and 4.

Figure 1:
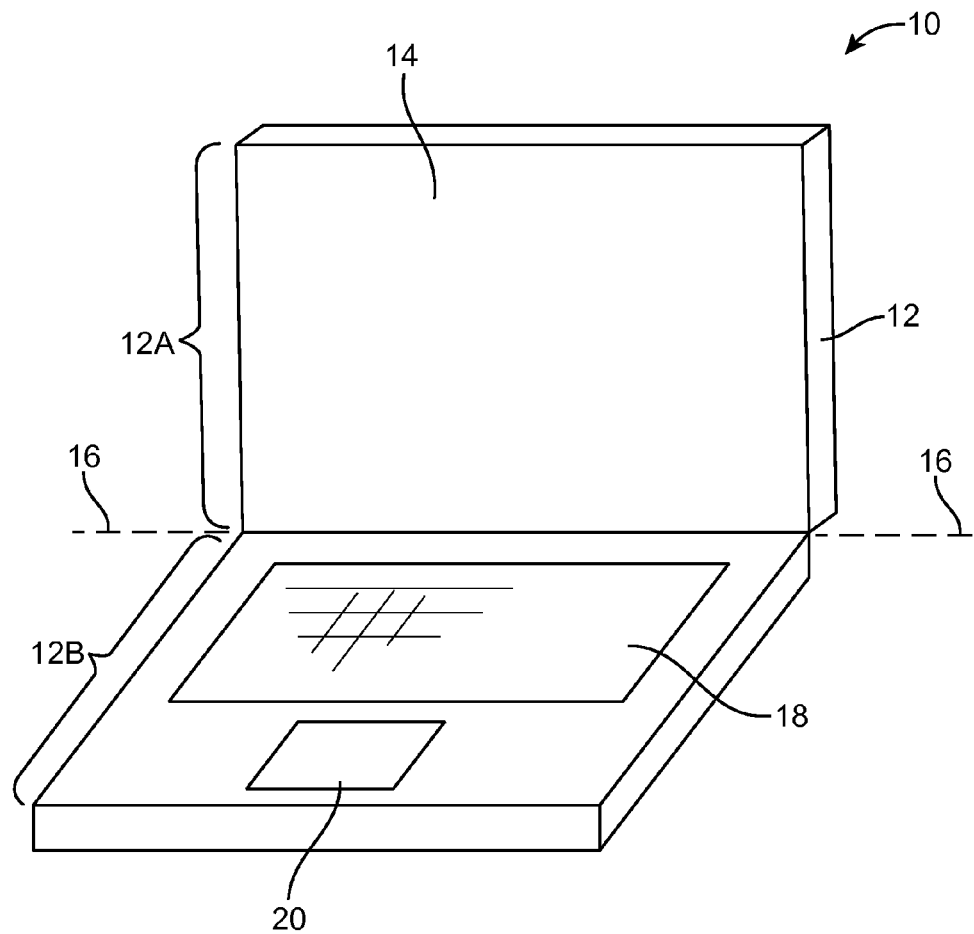
FIG. 1 is a diagram of an illustrative electronic device with a flexible circuit having a spreader layer such as a portable computer in accordance with an embodiment of the present invention.

An illustrative electronic device of the type that may be provided with flexible circuitry having a heat and pressure spreading layer is shown in FIG. 1. Electronic device 10 may be a computer such as a computer that is integrated into a display such as a computer monitor, a laptop computer, a tablet computer, a somewhat smaller portable device such as a wrist-watch device, pendant device, or other wearable or miniature device, a cellular telephone, a media player, a tablet computer, a gaming device, a navigation device, a computer monitor, a television, or other electronic equipment.

As shown in FIG. 1, device 10 may include a display such as display 14. Display 14 may be a touch screen that incorporates capacitive touch electrodes or other touch sensor components or may be a display that is not touch sensitive. Display 14 may include image pixels formed from liquid crystal display (LCD) components or other suitable display pixel structures. Arrangements in which display 14 is formed using liquid crystal display pixels are sometimes described herein as an example. This is, however, merely illustrative. Any suitable type of display technology may be used in forming display 14 if desired.

Display 14 may be substantially filled with active display pixels or may have an active portion and an inactive portion. An inactive portion of the display may include display circuitry for delivering electrical signals to display pixels. For example, a flexible printed circuit having a heat and pressure spreading layer may be attached to a display layer such as a TFT glass layer in an inactive region of the display. Display circuitry in an inactive portion of display 14 may be hidden from view by, for example, an opaque coating on a display cover layer. The size of the inactive portion of a display may be reduced by providing a flexible printed circuit with a heat and pressure spreading layer that enables precise positioning of a bonding tool during bonding of the flexible printed circuit to the TFT glass layer.

Device 10 may have a housing such as housing 12. Housing 12, which may sometimes be referred to as a case, may be formed of plastic, glass, ceramics, fiber composites, metal (e.g., stainless steel, aluminum, etc.), other suitable materials, or a combination of any two or more of these materials.

Housing 12 may be formed using a unibody configuration in which some or all of housing 12 is machined or molded as a single structure or may be formed using multiple structures (e.g., an internal frame structure, one or more structures that form exterior housing surfaces, etc.).

As shown in FIG. 1, housing 12 may have multiple parts. For example, housing 12 may have upper portion 12A and lower portion 12B. Upper portion 12A may be coupled to lower portion 12B using a hinge that allows portion 12A to rotate about rotational axis 16 relative to portion 12B. A keyboard such as keyboard 18 and a touch pad such as touch pad 20 may be mounted in housing portion 12B.

Figure 2:
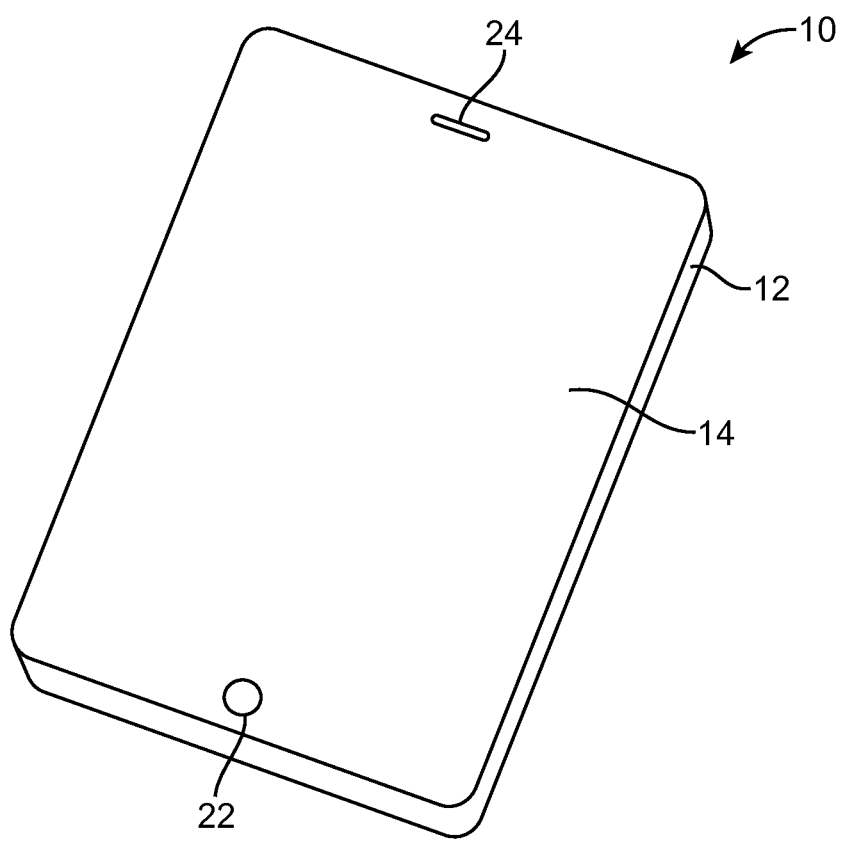
FIG. 2 is a diagram of an illustrative electronic device with a flexible circuit having a spreader layer such as a cellular telephone or other handheld device in accordance with an embodiment of the present invention.

In the example of FIG. 2, device 10 has been implemented using a housing that is sufficiently small to fit within a user's hand (i.e., device 10 of FIG. 2 may be a handheld electronic device such as a cellular telephone). As show in FIG. 2, device 10 may include a display such as display 14 mounted on the front of housing 12. Display 14 may have openings (e.g., openings in the inactive or active portions of display 14) such as an opening to accommodate button 22 and an opening to accommodate speaker port 24.

Figure 3:
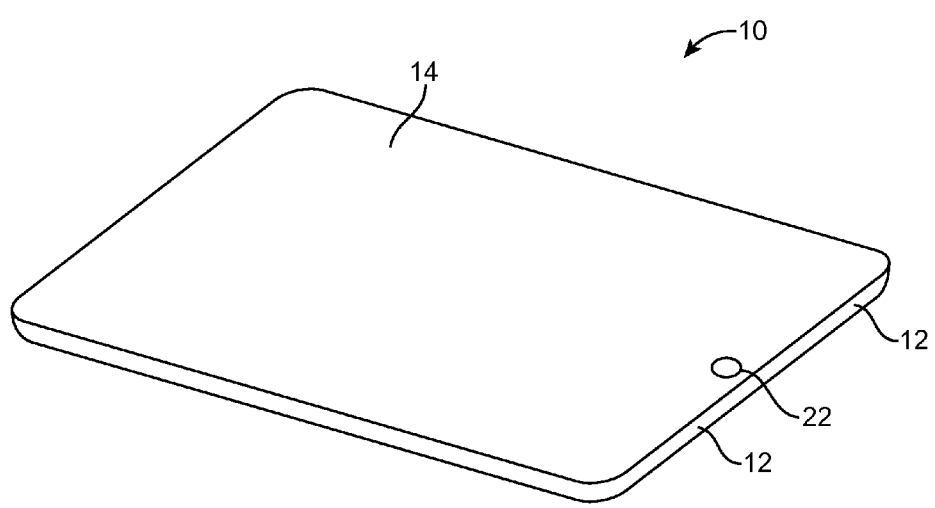
FIG. 3 is a diagram of an illustrative electronic device with a flexible circuit having a spreader layer such as a tablet computer in accordance with an embodiment of the present invention.

FIG. 3 is a perspective view of electronic device 10 in a configuration in which electronic device 10 has been implemented in the form of a tablet computer. As shown in FIG. 3, display 14 may be mounted on the upper (front) surface of housing 12. An opening may be formed in display 14 to accommodate button 22.

Figure 4:
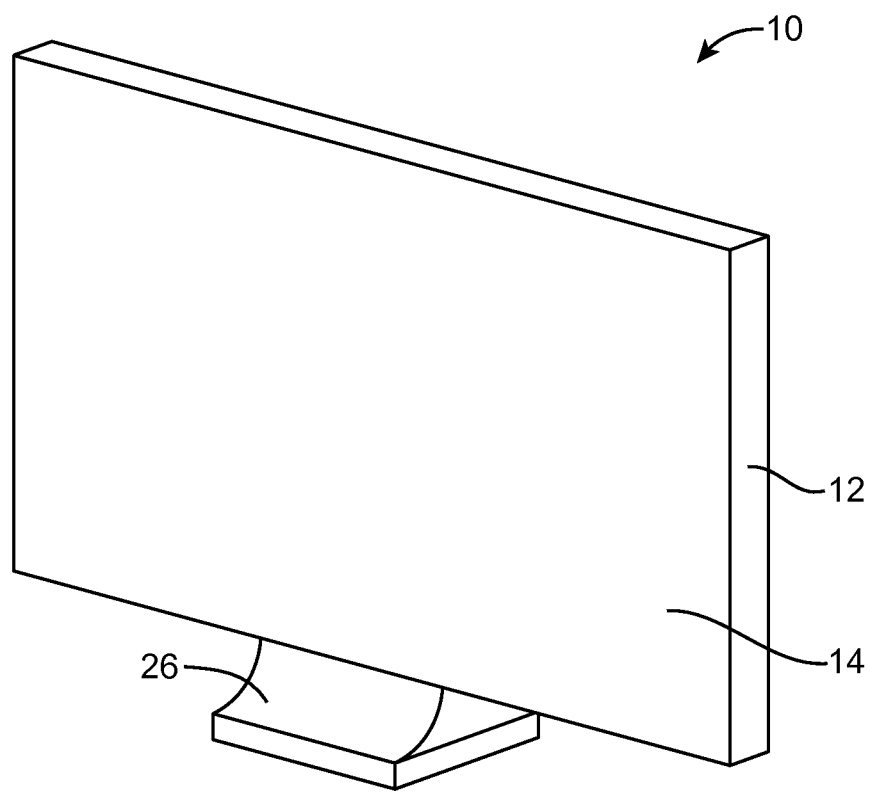
FIG. 4 is a diagram of an illustrative electronic device with a flexible circuit having a spreader layer such as a computer monitor with a built-in computer in accordance with an embodiment of the present invention.

FIG. 4 is a perspective view of electronic device 10 in a configuration in which electronic device 10 has been implemented in the form of a computer integrated into a computer monitor. As shown in FIG. 4, display 14 may be mounted on the front surface of housing 12. Stand 26 may be used to support housing 12.

Display 14 may include an array of display pixels. Each display pixel may be used to control the light intensity associated with a portion of the display.

Figure 5:
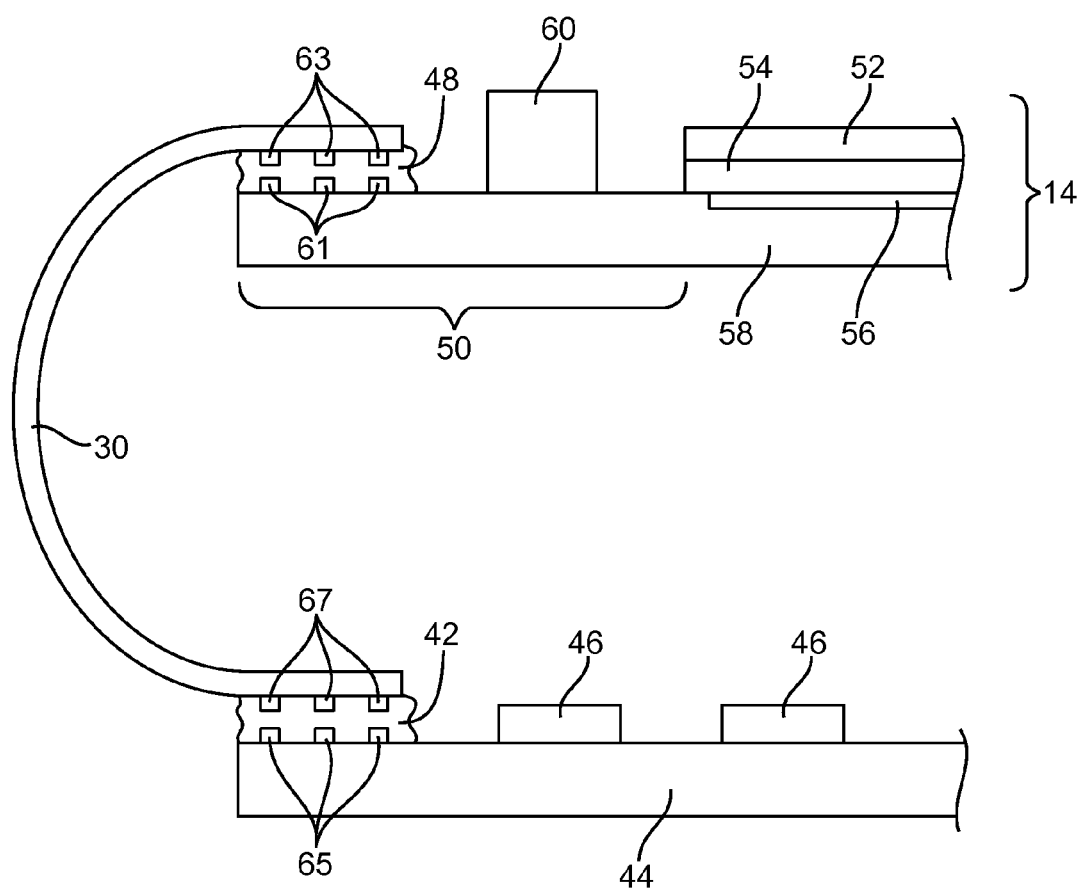
FIG. 5 is a cross-sectional side view of illustrative circuitry in an electronic device such as a display and a printed circuit board coupled using a flexible printed circuit with a spreader layer in accordance with an embodiment of the present invention.

A cross-sectional side view of an illustrative configuration that may be used for connecting flexible circuitry such as flexible circuitry 30 to a rigid circuit member such as display 14 of device 10 (e.g., device 10 of FIG. 1, FIG. 2, FIG. 3, or FIG. 4 or other suitable electronic devices) is shown in FIG. 5. As shown in FIG. 5, display 14 may include one or more display layers such as color filter glass layer 52, liquid crystal layer 54, and thin-film transistor (TFT) glass layer 58. In some configurations, color filter glass layer 52, liquid crystal layer 54, and thin-film transistor (TFT) glass layer 58 are interposed between polarizer layers.

Color filter glass layer 52 may contain an array of colored filters that provide display 14 with the ability to represent different colors. Liquid crystal material in liquid crystal layer 54 may be controlled electrically (e.g., selectively polarized) by thin-film transistor array 56. Thin-film transistors in array 56 may be formed on the upper surface of thin-film transistor (TFT) glass layer 58.

Thin-film transistors 56 may be controlled by drivers contained in driver circuit 60. Color filter layer 52 may be horizontally (laterally) recessed with respect to TFT layer 58 to form a ledge such as ledge 50. Driver circuit 60 and flexible circuitry 30 may be attached to ledge 50.

Display 14 may include a number of driver chips such as circuit 60 that are mounted around the periphery of the display. Conductive traces on the upper surface of TFT layer 58 interconnect driver circuit 60 with thin-film transistors 56. The use of LCD technology is merely illustrative.

Flexible circuit substrate 30 (also referred to herein as flexible circuitry or a flexible printed circuit) and driver circuit 60 may be attached to ledge 50 using anisotropic conductive film (ACF) adhesive such as ACF adhesive 48. Flexible circuitry 30 may be a flexible printed circuit substrate ("flex circuit") such as a sheet of polyimide or other flexible dielectric having conductive traces (e.g., metal lines).

Conductive traces in flexible printed circuit 30 may route signals to circuitry such as circuit 60 from an additional rigid circuit member such as printed circuit board 44. Flexible printed circuit substrate 30 may include electrical contacts such as bond pads 63 and bond pads 67. Metal lines in flexible printed circuit 30 may interconnect bond pads 63 and bond pads 67. ACF adhesive 48 may be interposed between bond pads 63 of flexible printed circuit 30 and corresponding electrical contacts such as bond pads 61 on ledge 50 of TFT layer 58.

With one suitable arrangement, flexible circuitry 30 is connected to a main printed circuit board such as printed circuit board (PCB) 44 using ACF adhesive 42. Bond pads 67 on flexible printed circuit 30 may be aligned with electrical contacts such as bond pads 65 on PCB 44. ACF adhesive 42 may be interposed between bond pads 67 of flexible circuitry 30 and bond pads 65 of PCB 44.

Circuitry for device 10 may be mounted on printed circuit boards such as board 44 and/or may be coupled to the circuitry on printed circuit board 44 through additional signal lines (e.g., signal lines on additional flex circuits, signal lines on additional rigid printed circuit boards, etc). This circuitry may include, for example, components 46.

Components 46 may include control circuitry such as control circuitry based on one or more processing integrated circuits (e.g., microprocessors) and storage (e.g., volatile and non-volatile memory). Components 46 may include communications circuits such as integrated circuits for communicating over serial buses and parallel buses with internal components and external equipment that is connected to device 10 by a cable and a connector in device 10 and/or internal circuits in device 10.

Discrete components may be mounted on board 44 with other components. Examples of discrete components are inductors, capacitors, and resistors. Other components 46 that may be mounted on board 44 or elsewhere in device 10 include switches, connectors, cameras, camera flash circuits (e.g., light-emitting diodes or other light sources that serve as a camera flash), and audio circuits.

Components 46 may include video chips such as one or more display driver integrated circuits for displaying images on display 14 and a video driver integrated circuit or circuits for driving video signals onto a monitor or other external display that is coupled to device 10. Accessory interface circuitry such as circuitry that is associated with an external component that is controlled by device 10 and/or that provides input to device 10 and other circuits and devices may also be included in components 46 if desired.

During assembly of device 10, a bonding tool such as a heat bar may be used to bond flexible printed circuit 30 to TFT layer 58 and/or to PCB 44. For example, a heat bar may be heated and pressed against flexible printed circuit 30 in order to generate heat and pressure that causes ACF 48 to form conductive paths between electrical contacts 63 and 61.

Common flexible printed circuit substrates may be heat sensitive or may have non-uniformities that can cause heat and pressure from a heat bar to be applied non-uniformly to the substrate. This can have undesirable consequences for the robustness of the ACF bond to a rigid circuit member. In some situations an additional bonding sheet may be placed between a heat bar and a flexible printed circuit during bonding to spread heat and pressure across the flexible printed circuit. However, an additional bonding sheet that is inserted during bonding may sometimes contact and damage or dislodge a component that is already attached to the rigid circuit member.

Additional unused space is sometimes therefore required in a device (e.g., additional inactive display area on a ledge of a TFT layer) in order to avoid this type of situation. For this reason, flexible printed circuit 30 may be provided with a layer of heat and pressure spreading material so that an additional bonding sheet is not necessary during the bonding process. A flexible printed circuit having a heat and pressure spreading layer may reduce the need for additional margin on TFT ledge 50 thereby reducing the size of an inactive portion of display 14.

Figure 6:
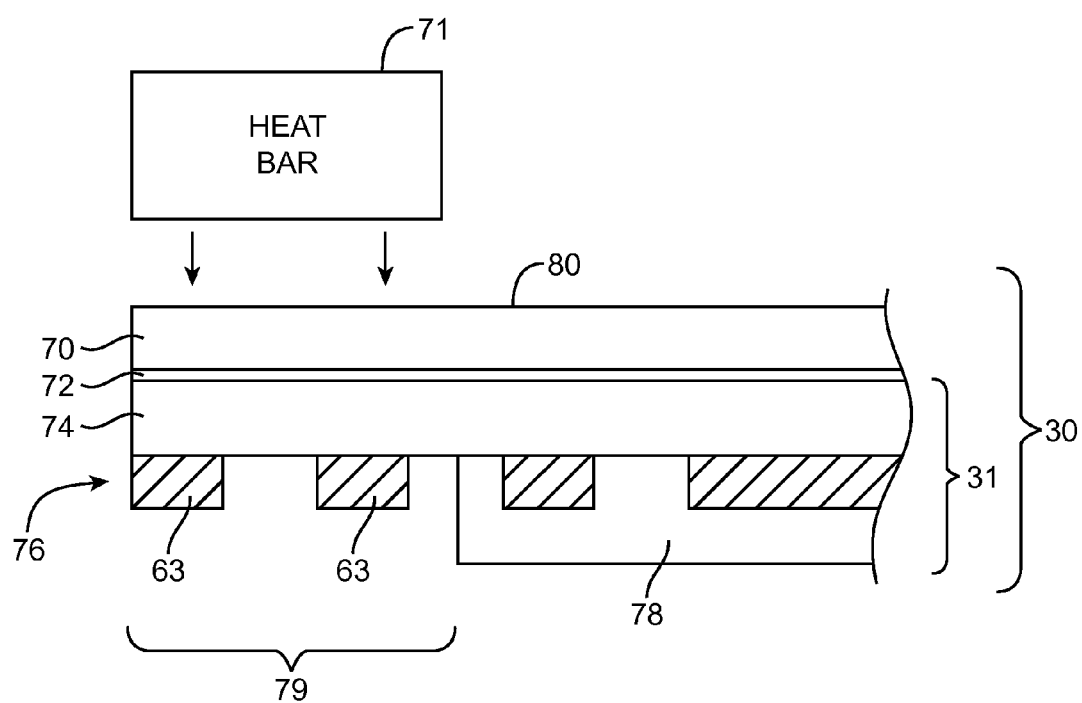
FIG. 6 is cross-sectional side view of a portion of an illustrative flexible circuit having a spreader layer in accordance with an embodiment of the present invention.

As shown in FIG. 6, a flexible printed circuit ("flex circuit") such as flexible printed circuit 30 may be provided with an insulating layer such as heat and pressure spreading layer 70 on a flex circuit layer such as flex circuit layer 31. Heat and pressure spreading layer 70 (sometimes referred to herein as simply heat-spreading layer or pressure-spreading layer) may be formed from a suitable insulating material such as polytetrafluoroethylene, silicone or other suitable material for spreading heat and pressure. Heat-spreading layer 70 may be attached to a first surface of a flexible sheet of polymer such as polyimide layer 74 of flex circuit layer 31 using, for example, an adhesive such as adhesive 72.

As shown in FIG. 6, flex circuit layer 31 of flexible printed circuit 30 may include a conductive layer such as conductive layer 76 on an opposing second surface of polyimide layer 74. Conductive layer 76 may be a patterned conductive layer formed from printed conductive traces (e.g., copper, aluminum or other metal traces) on polyimide layer 74.

A portion of patterned conductive layer 76 may be covered by an insulating layer such as coverlay layer 78. A portion such as portion 79 of patterned conductive layer 76 may be exposed (e.g., uncovered by coverlay layer 76). Exposed portion 79 of conductive layer 76 may include electrical contacts such as bond pads 63 for electrically coupling flexible printed circuit 30 to a rigid circuit member such as TFT layer 58 of display 14 or PCB 44.

During assembly of device 10, bond pads 63 in portion 79 of flexible printed circuit 30 may be aligned with bond pads such as bond pads 61 (or bond pads 65) of FIG. 5. ACF adhesive may be provided between bond pads 63 and bond pads 61. A heated bonding tool such as heat bar 71 may then be heated and pressed against pressure-spreading layer 70 of flexible printed circuit 30 in order to bond flexible printed circuit 30 to, for example, TFT layer 58.

Heat-spreading layer 70 may be configured to spread heat and pressure from heated ACF bonding tool 71 evenly (uniformly) over surface 80 of flexible printed circuit 30.

During manufacturing of flexible printed circuit 30, a sheet of flexible printed circuitry having a layer of flexible polymer (e.g., polyimide layer 74), a patterned conductive layer (e.g., patterned conductive layer 76) on a first surface of the layer of flexible polymer, and an insulating layer (e.g., coverlay layer 78) on a portion of the layer of flexible polymer over a corresponding portion (e.g., portion 79) of the patterned conductive layer may be provided.

A layer of insulating material (e.g., a polytetrafluoroethylene or silicone heat and pressure spreading layer such as layer 70) may be formed on an opposing second surface of the flexible polymer substrate in order to spread heat and pressure across the second surface of the flexible polymer substrate when pressed by a bonding tool. As an example, heat-spreading layer 70 may be formed on the opposing second surface of the flexible polymer substrate by roll-laminating a sheet of heat-spreading material (e.g., polytetrafluoroethylene, silicone, etc.) onto the flexible polymer substrate. Multiple flexible printed circuits such as flexible printed circuit 30 having heat and pressure spreading layers may then be formed by die cutting the sheet of flexible printed circuitry that has the layer of insulating material formed on the opposing second surface.

In the example of FIG. 6, heat-spreading layer 70 extends along substantially the entire length of flexible printed circuit 30. However, this is merely illustrative. If desired, head-spreading layer 70 may be formed only on portion 79 of flexible printed circuit 30 as shown in FIG. 7.

Heat-spreading layer 70 may be formed only on portion 79 of flexible printed circuit 30 by forming heat-spreading layer 70 along the entire length of a sheet of flexible polymer substrate and removing a portion of heat-spreading layer 70 from the sheet of flexible polymer substrate before or after die cutting the sheet of flexible printed circuitry (as described above in connection with FIG. 6). If desired, heat-spreading layer 70 may be formed on portion 79 of flexible printed circuit 30 by attaching a strip of heat-spreading material 70 that has a width equal to the width of portion 79 to top surface 82 of flex circuit layer 31 using adhesive 72.

Figure 7:
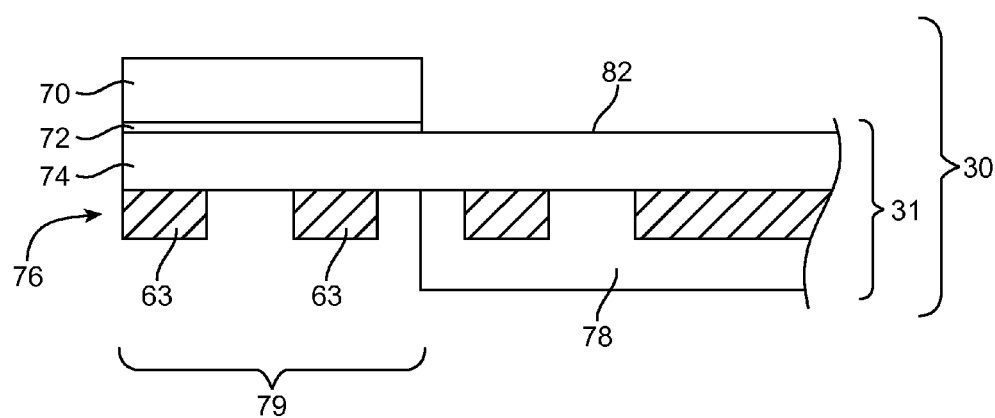
FIG. 7 is cross-sectional side view of a portion of an illustrative flexible circuit having a partial spreader layer in accordance with an embodiment of the present invention.
Figure 8:
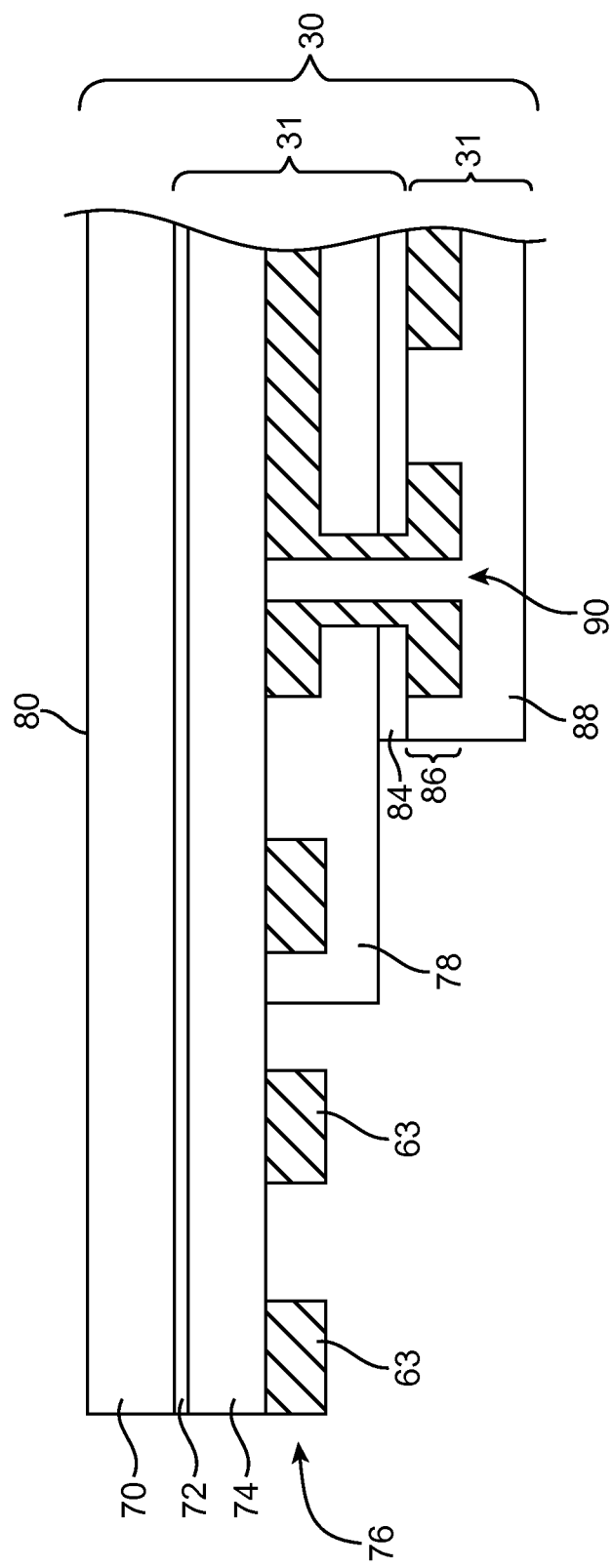
FIG. 8 is cross-sectional side view of a portion of an illustrative flexible circuit having multiple flex circuit layers and spreader layer in accordance with an embodiment of the present invention.

In the examples of FIGS. 6 and 7, flexible printed circuit 30 includes a single flex circuit layer 31. However, this is merely illustrative. As shown in FIG. 8, flexible printed circuit 30 may include a second flex circuit layer 31 attached to coverlay layer 78 using an adhesive such as adhesive 84. The second flex circuit layer 31 may include a conductive layer such as patterned conductive layer 86 (e.g., copper, aluminum or other metal traces) that is covered by a coverlay layer such as coverlay layer 88. Flexible printed circuit 30 may include one or more conductive vias such as plated through-hole 90 that interconnect conductive layer 76 with conductive layer 86.

Figure 9:
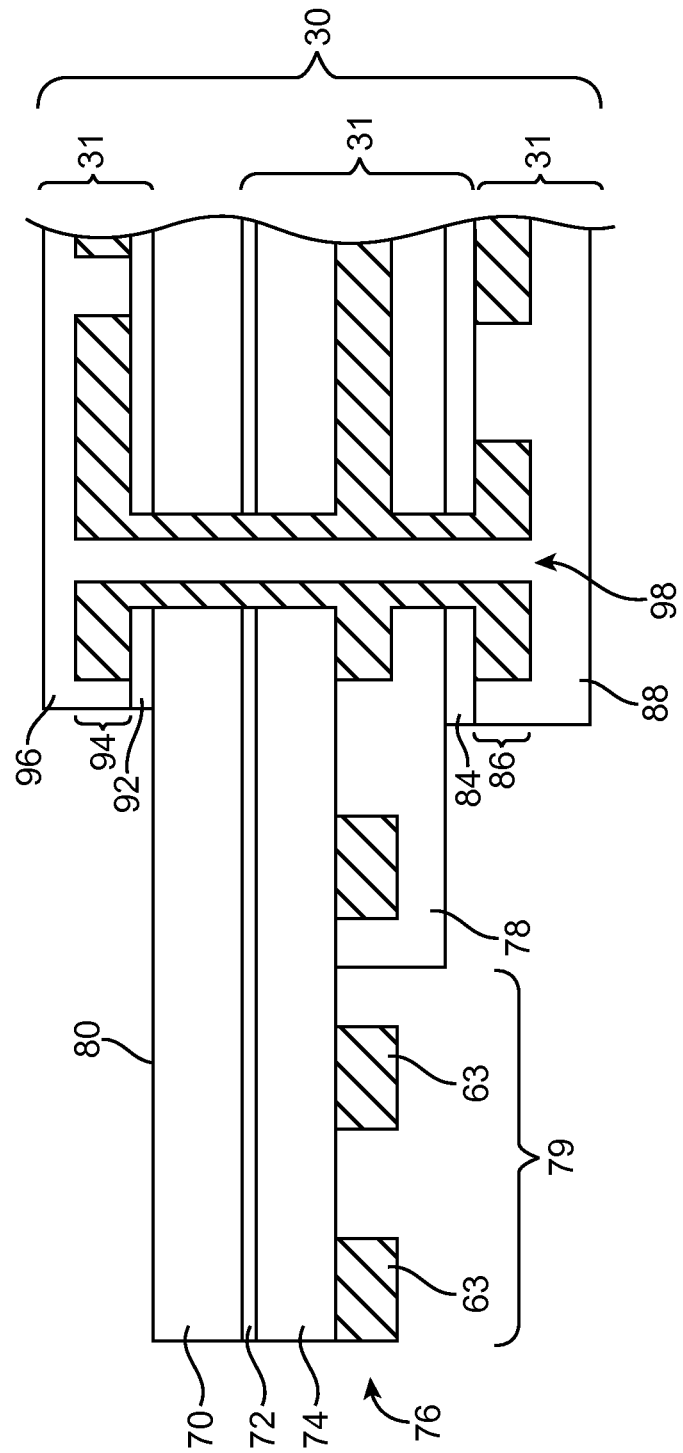
FIG. 9 is cross-sectional side view of a portion of an illustrative flexible circuit having a conductive via through a spreader layer in accordance with an embodiment of the present invention.

As shown in FIG. 9, flexible printed circuit 30 may, if desired, include a third flex circuit layer 31 attached to surface 80 of heat and pressure spreading layer 70 using adhesive 92. Third flex circuit layer 31 may include a conductive layer such as patterned conductive layer 94 (e.g., copper, aluminum or other metal traces) that is covered by a coverlay layer such as coverlay layer 96.

A flex circuit layer 31 that is attached to top surface 80 of pressure-spreading layer 70 may cover a portion of pressure-spreading layer 70 that is different from portion 79 of pressure-spreading layer 70 so that surface 80 of heat-spreading layer 70 remains exposed for pressing a bonding tool during assembly of device 10.

During manufacturing of flexible printed circuit 30, one or more additional sheets of flexible circuitry such as flex circuit layers 31 may be attached to coverlay layer 78 and/or pressure-spreading layer 70 using adhesive and one or more conductive vias (e.g., plated through-holes) may be formed between conductive layers of the flex circuit layers. As shown in FIG. 9, a conductive via such as plated through-hole 98 may interconnect conductive layers through flexible polymer layer 74, pressure-spreading layer 70, and coverlay layer 78. However, this is merely illustrative. Some conductive vias may pass through coverlay layer 78 without passing through polymer layer 74 and pressure-spreading layer 70. Some conductive vias may pass through polymer layer 74 and pressure-spreading layer 70 without passing through coverlay layer 78.

If desired, flexible printed circuit 30 may include two flex circuit layers, three flex circuit layers, four flex circuit layers or more than four flex circuit layers. Each flex circuit layer may include one or more flexible polymer layers, one or more coverlay layers, one or more adhesive layers, one or more conductive layers and may include conductive vias that interconnect conductive layers within the flex circuit layer and/or conductive vias that interconnect conductive layers of multiple flex circuit layers.

Figure 10:
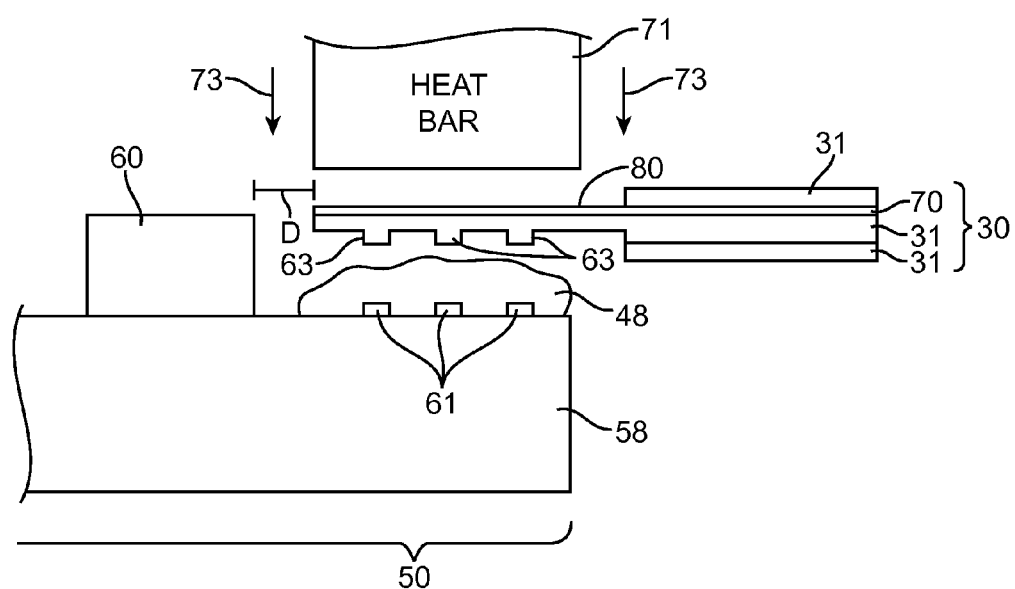
FIG. 10 is a diagram of an illustrative assembly system for attaching a flexible circuit having a spreader layer to a rigid circuit member in accordance with an embodiment of the present invention.

As shown in FIG. 10, during assembly of device 10, a component such as driver circuit 60 may be attached to a rigid circuit member such as TFT layer 58 of display 14. A bonding tool such as heat bar 71 may then be pressed against top surface 80 of heat-spreading layer 70 of flexible printed circuit 30 (e.g., in direction 73) in order to bond flexible printed circuit 30 to bond pads 61 of TFT layer 58 using ACF adhesive 48. Providing flexible printed circuit 30 with a heat and pressure spreading layer such as pressure-spreading layer (heat-spreading layer) 70 that has been die cut with flexible printed circuit 30 may enable precise positioning of bonding tool 71 during bonding of flexible printed circuit 30 to TFT layer 58. In this way, flexible printed circuit 30 may be mounted to TFT layer 58 at a distance D from component 60 that is less than the distance that would be required when bonding a conventional flex circuit to a TFT layer. As examples, distance D may be less than 0.3 mm, less than 0.2 mm, less than 0.1 mm, less than 0.5 mm, 0.1-0.2 mm, 0.1-0.3 mm, 0.1-0.2 mm or more than 0.3 mm.

Figure 11:
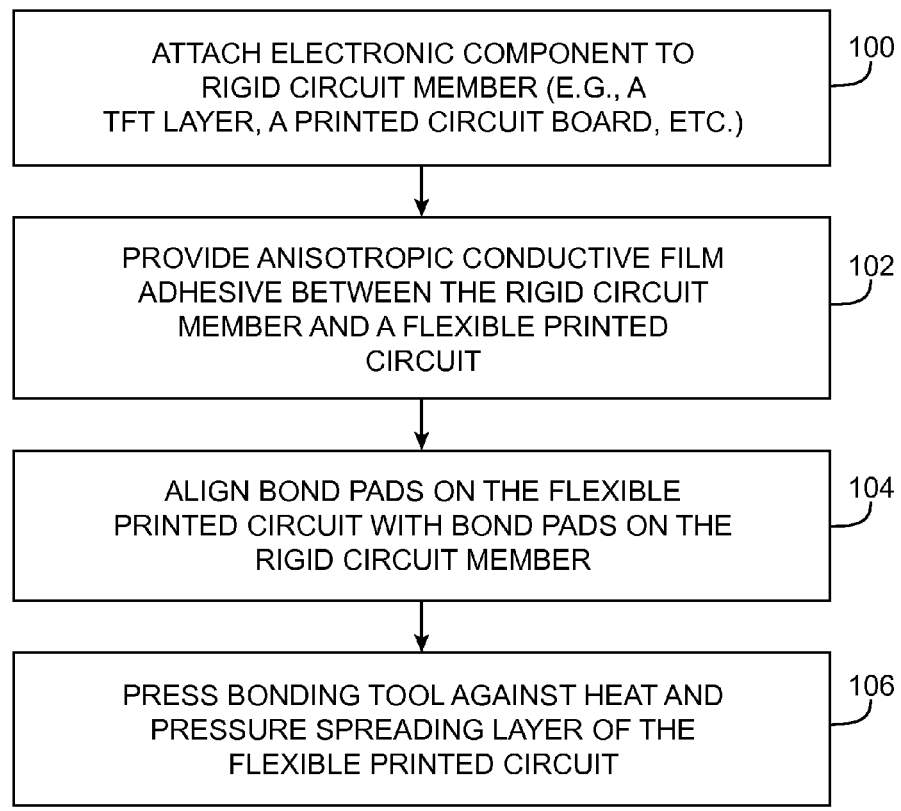
FIG. 11 is a flow chart of illustrative steps involved in attaching a flexible circuit having a spreader layer to a rigid circuit member in accordance with an embodiment of the present invention.

FIG. 11 is a flow chart of illustrative steps that may be involved in assembling device 10 using a flexible printed circuit having a heat and pressure spreading layer. At step 100, an electronic component such as a driver integrated circuit may be attached to a rigid circuit member such as a thin-film-transistor (TFT) glass layer of a display.

At step 102, an anisotropic conductive film (ACF) adhesive may be provided between the rigid circuit member and a flexible printed circuit. The ACF adhesive may be applied to the rigid circuit member, to the flexible printed circuit, or to both the rigid circuit member and the flexible printed circuit, At step 104, bond pads on the flexible printed circuit may be aligned with corresponding bond pads on the rigid circuit member.

At step 106, a bonding tool such as a heat bar may be pressed against a heat and pressure spreading layer (e.g., a layer of polytetrafluoroethylene, silicone or other suitable heat-spreading material) of the flexible printed circuit. Pressing the heat bar against the heat and pressure spreading layer of the flexible printed circuit may electrically couple the flexible printed circuit to the rigid circuit member by forming conductive portions in the ACF adhesive between the bond pads of the flexible printed circuit and the bond pads of the rigid circuit member.

Figure 12:
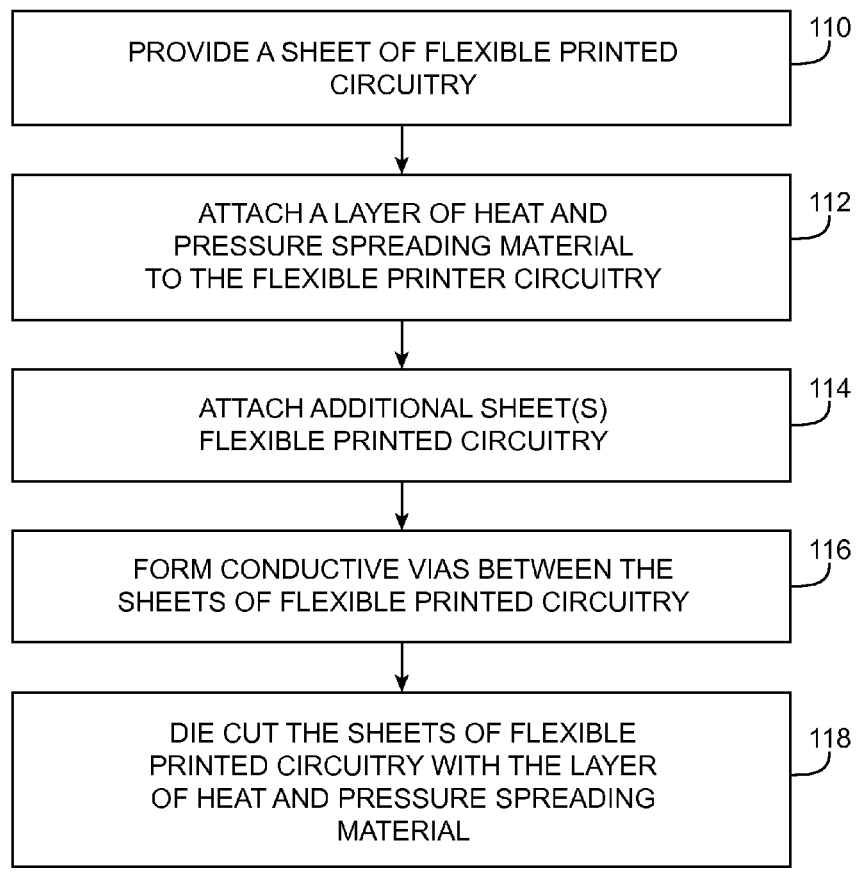
FIG. 12 is a flow chart of illustrative steps involved forming a flexible printed circuit having a spreader layer in accordance with an embodiment of the present invention.

FIG. 12 is a flow chart of illustrative steps that may be involved in manufacturing a flexible printed circuit having a heat and pressure spreading layer. At step 110, a sheet of flexible printed circuitry may be provided. The sheet of flexible printed circuitry may be a single-sided, double-sided, multilayer, or other suitable sheet of flexible printed circuitry.

At step 112, a layer of heat and pressure spreading material (e.g., a sheet of polytetrafluoroethylene, silicone or other suitable heat-spreading material) may be attached to the sheet of heat and pressure spreading material. The sheet of heat and pressure spreading material may, for example, be roll-laminated onto the sheet of flexible printed circuitry.

At optional step 114, one or more additional sheets of flexible printed circuitry (e.g., flex circuit layers 31) may be attached to the sheet of flexible circuitry and/or the layer of heat and pressure spreading material. In situations in which an additional sheet of flexible circuitry is attached to the sheet of heat and pressure spreading material, a portion of the sheet of heat and pressure spreading material may remain uncovered by the additional sheet of flexible circuitry to provide space for a bonding tool to press against the heat and pressure spreading material during assembly of an electronic device.

At optional step 116, one or more conductive vias such as plated through-holes may be formed between conductive layers in the sheets of flexible circuitry. Conductive vias may pass through layers of coverlay, flexible polymer layers, and/or the sheet of heat and pressure spreading material.

At step 118, the sheets of flexible circuitry having the attached sheet of heat and pressure spreading material may be die cut to form multiple flexible printed circuits each having a layer of heat and pressure spreading material for spreading heat and pressure when pressed by a bonding tool during assembly of an electronic device such as device 10.

Each sheet of flexible circuitry may include one or more flexible polymer sheets, one or more coverlay sheets, one or more adhesive layers, one or more conductive layers and may include conductive vias that interconnect conductive layers within the sheet of flexible circuitry and/or conductive vias that interconnect conductive layers of multiple sheets of flexible circuitry.

The foregoing is merely illustrative of the principles of this invention and various modifications can be made by those skilled in the art without departing from the scope and spirit of the invention.

What is claimed is:

1. A method of manufacturing flexible printed circuits, comprising:
   providing a sheet of flexible printed circuitry having a layer of flexible polymer, a patterned conductive layer on a first surface of the layer of flexible polymer, and an insulating layer over a portion of the patterned conductive layer;
   attaching a layer of material to an opposing second surface of the layer of flexible polymer, wherein the layer of material is configured to spread heat and pressure across the second surface of the layer of flexible polymer when pressed by a bonding tool; and
   die cutting the sheet of flexible printed circuitry that has the layer of material formed on the opposing second surface.

2. The method defined in claim 1 wherein the layer of material comprises a sheet of polytetrafluoroethylene and wherein attaching the layer of material to the opposing second surface comprises attaching the sheet of polytetrafluoroethylene to the opposing second surface using a layer of adhesive.

3. The method defined in claim 2, further comprising:
   providing at least one additional sheet of flexible circuitry having a patterned conductive layer;
   attaching the at least one additional sheet of flexible circuitry to the layer of material on the opposing second surface of the layer of flexible polymer; and
   forming at least one conductive via through the layer of material on the opposing second surface, wherein the at least one conductive via electrically couples the patterned conductive layer of the sheet of flexible circuitry to the patterned conductive layer of the at least one additional sheet of flexible circuitry.

4. The method defined in claim 1 wherein attaching the layer of material to the opposing second surface of the layer of flexible polymer comprises roll-laminating a sheet of the material onto the opposing second surface of the layer of flexible polymer.

5. A flexible printed circuit, comprising:
   a flexible polymer substrate having opposing first and second surfaces;
   a patterned conductive layer formed on the second surface of the flexible polymer substrate; and
   a layer of insulating material on the first surface of the flexible polymer substrate that is configured to distribute pressure across the first surface of the flexible polymer substrate when pressed by a bonding tool.

6. The flexible printed circuit defined in claim 5 wherein the layer of insulating material is configured to spread heat and pressure applied by a heated anisotropic-conductive-film bonding tool.

7. The flexible printed circuit defined in claim 6 wherein the layer of insulating material comprises a layer of polytetrafluoroethylene.

8. The flexible printed circuit defined in claim 6 wherein the layer of insulating material comprises silicone.

9. The flexible printed circuit defined in claim 5 wherein the flexible polymer substrate comprises a flexible polyimide layer.

10. The flexible printed circuit defined in claim 5, further comprising an insulating coverlay over a portion of the patterned conductive layer on the second surface of the flexible polymer substrate.

11. The flexible printed circuit defined in claim 10 wherein the patterned conductive layer comprises a first patterned conductive layer, the flexible printed circuit further comprising:
   an adhesive layer formed on a portion of the insulating coverlay;
   a second patterned conductive layer attached to the insulating coverlay using the adhesive layer; and
   a conductive via that electrically couples the first patterned conductive layer to the second patterned conductive layer.

12. The flexible printed circuit defined in claim 11, further comprising:
   an second adhesive layer formed on a portion of the layer of insulating material;
   a third patterned conductive layer attached to the portion of the layer of insulating material using the second adhesive layer; and
   a conductive via that electrically couples the second patterned conductive layer to the third patterned conductive layer through the layer of insulating material.

13. The flexible printed circuit defined in claim 5, wherein the layer of insulating material comprises a die cut layer of insulating material.

14. The flexible printed circuit board defined in claim 5, wherein the flexible polymer substrate has a length and the layer of insulating material extends across the length of the flexible printed circuit.

15. The flexible printed circuit board defined in claim 5, wherein the flexible polymer substrate has a length and the layer of insulating material extends only along a portion of the length of the flexible polymer substrate.

16. The flexible printed circuit board defined in claim 15, further comprising:
   a layer of adhesive formed along the portion of the length of the flexible polymer substrate, wherein the layer of adhesive is interposed between the flexible polymer substrate and the layer of insulating material and attaches the layer of insulating material to the flexible polymer substrate.

17. The flexible printed circuit board defined in claim 16, wherein the layer of insulating material is further configured to distribute heat across the first surface of the flexible polymer substrate when pressed by the bonding tool.

18. The flexible printed circuit board defined in claim 17, wherein the flexible polymer substrate comprises a flexible polyimide layer and the layer of insulating material comprises a layer of polytetrafluoroethylene.

19. The flexible printed circuit board defined in claim 18, wherein the patterned conductive layer comprises bond pads for electrically coupling the printed circuit board to a rigid circuit member.

20. The flexible printed circuit board defined in claim 5, wherein the layer of insulating material on the first surface of the flexible polymer substrate is further configured to distribute heat and the pressure uniformly across the first surface of the flexible polymer substrate when pressed by the bonding tool.

* * * * *